US012463018B2

(12) United States Patent
Lim et al.

(10) Patent No.: US 12,463,018 B2
(45) Date of Patent: Nov. 4, 2025

(54) EDGE RING, SUBSTRATE PROCESSING APPARATUS HAVING THE SAME AND METHOD OF MANUFACTURING SEMICONDUCTOR DEVICE USING THE APPARATUS

(71) Applicant: Samsung Electronics Co., Ltd., Suwon-si (KR)

(72) Inventors: Hongtaek Lim, Seoul (KR); Junghyeon Kim, Yongin-si (KR); Sanggon Shin, Hwaseong-si (KR); Oleg Feygenson, Hwaseong-si (KR); Kyuho Lee, Hwaseong-si (KR); Donghoon Han, Seoul (KR); Kwangpyo Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1016 days.

(21) Appl. No.: 17/027,460

(22) Filed: Sep. 21, 2020

(65) Prior Publication Data

US 2021/0202217 A1 Jul. 1, 2021

(30) Foreign Application Priority Data

Dec. 31, 2019 (KR) ........................ 10-2019-0178956

(51) Int. Cl.
*H01J 37/32* (2006.01)
*C23C 16/458* (2006.01)

(52) U.S. Cl.
CPC .... *H01J 37/32642* (2013.01); *C23C 16/4585* (2013.01)

(58) Field of Classification Search
CPC ................................................. H01J 37/32642
See application file for complete search history.

(56) References Cited

U.S. PATENT DOCUMENTS 5,578,532 A * 11/1996 van de Ven ....... C23C 16/45519 438/584
5,711,815 A * 1/1998 Lee .................. C23C 16/45521 118/728

(Continued)

FOREIGN PATENT DOCUMENTS

KR 10-2007-0051014 A 5/2007
KR 20-2013-0006691 U 11/2013

(Continued)

*Primary Examiner* — Parviz Hassanzadeh
*Assistant Examiner* — Margaret Klunk
(74) *Attorney, Agent, or Firm* — Muir Patent Law, PLLC

(57) ABSTRACT

An edge ring includes an annular body portion having a bottom surface and a top surface, a first step portion extending along an inner periphery of the body portion and having an annular first bottom surface positioned higher than the bottom surface of the body portion by a first height, an inclined portion extending along an inner periphery of the first step portion and having an inclined bottom surface extending at a first angle with respect to a first plane in which the first bottom surface is placed, a second step portion extending along an inner periphery of the inclined portion and having a second bottom surface positioned higher than the bottom surface of the body portion by a second height greater than the first height, and a plurality of passages extending outwardly from the first bottom surface of the first step portion at a second angle with respect to the first bottom surface.

13 Claims, 11 Drawing Sheets

(56) References Cited

U.S. PATENT DOCUMENTS

| | | | | |
|---|---|---|---|---|
| 6,051,122 | A * | 4/2000 | Flanigan ............. C23C 16/4585 204/298.31 |
| 6,096,135 | A * | 8/2000 | Guo .................. H01L 21/67109 118/728 |
| 6,277,198 | B1 | 8/2001 | Yao et al. |
| 6,296,712 | B1 * | 10/2001 | Guo .................. C23C 16/45521 118/500 |
| 6,374,512 | B1 | 4/2002 | Guo et al. |
| 6,521,292 | B1 * | 2/2003 | Yudovsky ............. C23C 16/455 118/500 |
| 7,943,007 | B2 | 5/2011 | Bailey, III et al. |
| 8,398,778 | B2 | 3/2013 | Fang et al. |
| 9,053,925 | B2 | 6/2015 | Bailey, III et al. |
| 9,997,381 | B2 | 6/2018 | McMillin et al. |
| 10,006,121 | B2 | 6/2018 | Cho et al. |
| 10,227,695 | B2 | 3/2019 | Du Bois et al. |
| 2003/0196604 | A1 * | 10/2003 | Sidhwa ............. H01L 21/68735 118/728 |
| 2007/0065597 | A1 | 3/2007 | Kaido et al. |
| 2007/0193688 | A1 * | 8/2007 | Dhindsa .............. C23C 16/4585 156/345.43 |
| 2011/0263123 | A1 * | 10/2011 | Gomi ................ C23C 16/45521 438/681 |
| 2013/0264015 | A1 | 10/2013 | Fang et al. |
| 2014/0273460 | A1 * | 9/2014 | Reyland ............ H01L 21/76805 438/694 |
| 2017/0301565 | A1 | 10/2017 | Fang et al. |
| 2017/0301566 | A1 | 10/2017 | Fang et al. |
| 2018/0112309 | A1 * | 4/2018 | Kamio .............. C23C 16/45544 |
| 2018/0142340 | A1 | 5/2018 | Johanson et al. |

FOREIGN PATENT DOCUMENTS

| | | | |
|---|---|---|---|
| KR | 10-1597127 | B1 | 2/2016 |
| KR | 10-2019-0056021 | A | 5/2019 |
| KR | 20-2019-0002504 | U | 10/2019 |

* cited by examiner

EDGE RING, SUBSTRATE PROCESSING APPARATUS HAVING THE SAME AND METHOD OF MANUFACTURING SEMICONDUCTOR DEVICE USING THE APPARATUS

PRIORITY STATEMENT

This application claims priority under 35 U.S.C. § 119 to Korean Patent Application No. 10-2019-0178956, filed on Dec. 31, 2019 in the Korean Intellectual Property Office (KIPO), the contents of which are herein incorporated by reference in their entirety.

BACKGROUND

1. Field

Example embodiments relate to an edge ring and a substrate processing apparatus having the same. More particularly, example embodiments relate to an edge ring used for deposition distribution in an edge region of a wafer and a substrate processing apparatus having the same. The present disclosure also relates to a method of manufacturing semiconductor devices using the apparatus.

2. Description of the Related Art

An edge ring may be mounted on a substrate stage of a substrate processing apparatus for depositing a metal film, such as tungsten, on a wafer. The edge ring may be helpful in improving deposition distribution of the metal film in an edge region of the wafer. In an embodiment, a backside gas supply channel for supplying a backside gas may be formed in the substrate stage to suppress deposition at a bevel site and control the deposition distribution in the edge region. However, in conventional edge rings, when the deposition suppression at the bevel site is relatively good, the deposition distribution/uniformity in the edge region may be deteriorated relatively or, conversely, when the deposition distribution/uniformity in the edge region is relatively good, the deposition at the bevel site may not be suppressed sufficiently.

SUMMARY

Example embodiments provide an edge ring capable of providing improved deposition characteristics at a bevel portion and an edge region of a wafer.

Example embodiments provide a substrate processing apparatus having the edge ring.

According to example embodiments, an edge ring includes an annular shaped body portion having an annular bottom surface and an annular top surface, a first step portion extending along an inner periphery of the body portion and having an annular first bottom surface positioned higher than the bottom surface of the body portion by a first height H1, an inclined portion extending along an inner periphery of the first step portion and having an inclined bottom surface extending at a first angle with respect to a first plane in which the first bottom surface is placed, a second step portion extending along an inner periphery of the inclined portion and having an annular second bottom surface positioned higher than the bottom surface of the body portion by a second height H2 greater than the first height H1, and a plurality of passages extending outwardly from the first bottom surface of the first step portion at a second angle with respect to the first bottom surface. A first radial distance L4 from a position of each of the passages in the first plane to a foot of perpendicular to the first plane drawn from the inner periphery of the inclined portion is greater than a radial distance L3 of the second step portion from the innermost point to the outermost point of the second step portion.

According to example embodiments, a substrate processing apparatus includes a substrate stage having a wafer seating surface, and an edge ring configured to be supported by the substrate stage. The edge ring includes an annular shaped body portion configured to be mounted on the substrate stage and having an annular bottom surface and an annular top surface, a first step portion extending along an inner periphery of the body portion and having an annular first bottom surface positioned higher than the bottom surface of the body portion by a first height H1, an inclined portion extending along an inner periphery of the first step portion and having an inclined bottom surface extending at a first angle with respect to a first plane in which the first bottom surface is placed, a second step portion extending along an inner periphery of the inclined portion, the second step portion configured to vertically overlap a wafer seated on the wafer seating surface, the second step portion having an annular second bottom surface positioned higher than the bottom surface of the body portion by a second height H2 greater than the first height H1, and a plurality of passages extending outwardly at a second angle from the first bottom surface of the first step portion. The inclined bottom surface of the inclined portion is positioned to face an end portion of the wafer stated on the wafer seating surface.

According to example embodiments, an edge ring may include a first step portion, an inclined portion and a second step portion sequentially provided around an inner periphery of a body portion. An inclined bottom surface of the inclined portion may be arranged between a first bottom surface of the first step portion and a second bottom surface of the second step portion.

A backside gas supplied between an end portion of a wafer and an edge ring through a backside gas channel may proceed toward the inclined bottom surface of the inclined portion, and then, a first portion of the backside gas may pass through a through hole via a gap formed between the first bottom surface and the substrate stage to be discharged into a chamber and a remaining second portion of the backside gas may pass through a gap formed between the end portion of the wafer and the second bottom surface to be discharged into the chamber.

Thus, the concentration distribution of the first portion and the second portion of the backside gas may be adjusted to provide improved deposition characteristics at a bevel site and an edge region of the wafer.

BRIEF DESCRIPTION OF THE DRAWINGS

Example embodiments will be more clearly understood from the following detailed description taken in conjunction with the accompanying drawings.

FIG. 1 is a plan view illustrating a substrate processing apparatus in accordance with example embodiments.

FIG. 2 is a cross-sectional view illustrating a chamber of the substrate processing apparatus in FIG. 1.

FIG. 3 is a plan view illustrating an edge ring mounted on a substrate stage of the substrate processing apparatus in FIG. 2.

FIG. 4 is a cross-sectional view illustrating a portion of the edge ring in FIG. 3.

FIG. 5 is a plan view illustrating a portion of the edge ring in FIG. 3.

FIGS. 6 and 7 are cross-sectional views illustrating a portion of the edge ring mounted on the substrate stage.

FIG. 8 is a graph showing gas concentrations at an end portion of a wafer according to an edge ring in accordance with first and second comparative examples and an example embodiment.

FIG. 9 is a plan view illustrating a portion of an edge ring in accordance with example embodiments.

FIG. 10 is a plan view illustrating a portion of an edge ring in accordance with example embodiments.

FIG. 11 is a cross-sectional view taken along the line B-B' in FIG. 10.

FIG. 12 is a cross-sectional view taken along the line C-C' in FIG. 10.

FIG. 13 is a cross-sectional view illustrating a portion of the edge ring mounted on a substrate stage.

DETAILED DESCRIPTION OF EXAMPLE EMBODIMENTS

Hereinafter, example embodiments will be explained in detail with reference to the accompanying drawings.

Figure 1:
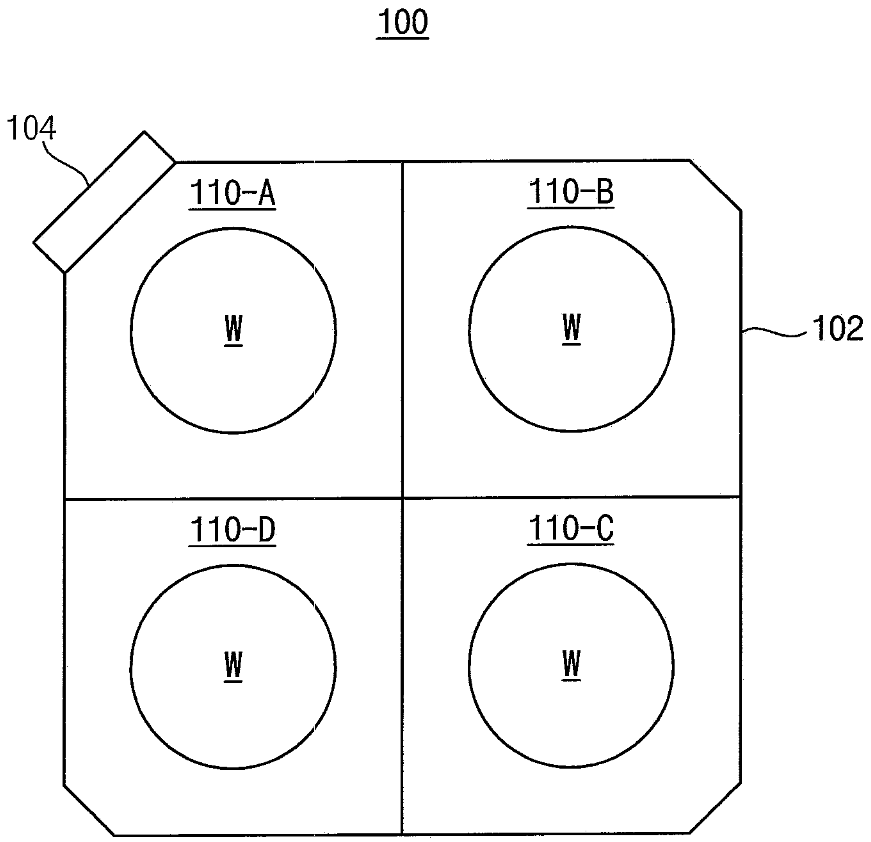
FIGS. 1 to 13 represent non-limiting, example embodiments as described herein.
Figure 2:
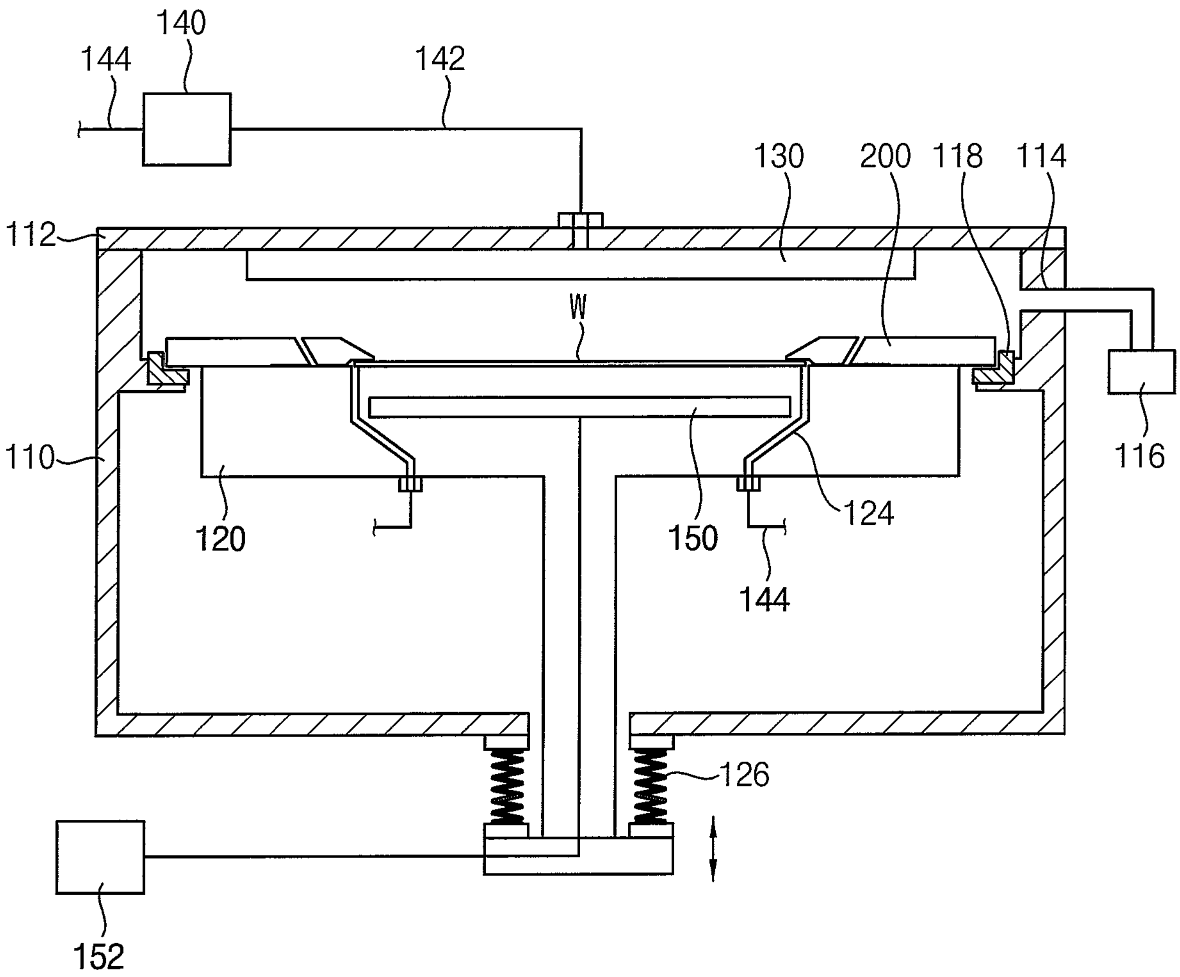
Figure 3:
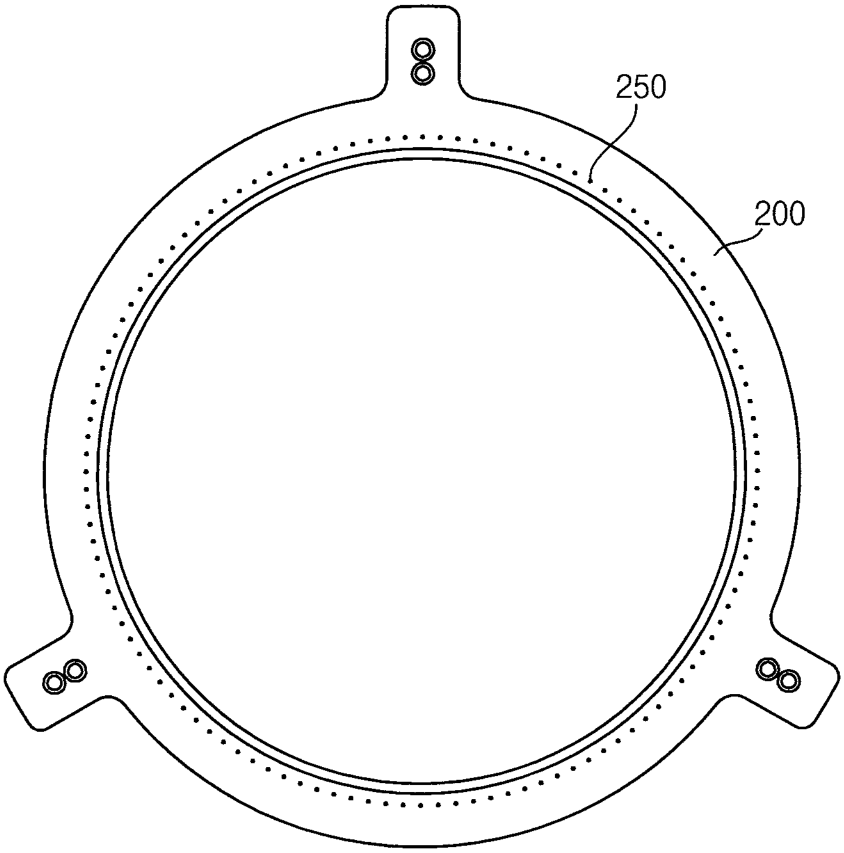

FIG. 1 is a plan view illustrating a substrate processing apparatus in accordance with example embodiments. FIG. 2 is a cross-sectional view illustrating a chamber of the substrate processing apparatus in FIG. 1. FIG. 3 is a plan view illustrating an edge ring mounted on a substrate stage of the substrate processing apparatus in FIG. 2.

Referring to FIGS. 1 to 3, a substrate processing apparatus 100 may include a plurality of chambers 110-A, 110-B, 110-C and 110-D which sequentially perform different processes. The substrate processing apparatus 100 may include sidewall partitions to divide a processing space into the chambers. At least one of the chambers may perform a selective layer deposition process on a wafer W using vapor deposition.

For example, processing in the chambers may be repeated one or more times, and each iteration may correspond to one ALD cycle. The substrate processing apparatus 100 may further include a gate valve 104 for loading and unloading the wafer W.

As illustrated in FIG. 2, the substrate processing apparatus 100 may include a chamber 110, a substrate stage 120, a gas distribution assembly configured to provide and distribute processing gas into the chamber, and an edge ring 200. In an embodiment, the substrate processing apparatus 100 may further include a plasma generator configured to generate plasma within the chamber 110. The substrate processing apparatus 100 may further include an exhaust portion 116.

In example embodiments, the substrate processing apparatus 100 may be a deposition apparatus configured to deposit a layer on a substrate such as a semiconductor wafer W. The substrate processing apparatus 100 may be a chemical vapor deposition (CVD) apparatus or an atomic layer deposition (ALD) apparatus. However, embodiments are not limited thereto. For example, the substrate processing apparatus 100 may be an etching apparatus. Here, the substrate may include a semiconductor substrate, a glass substrate, etc.

The chamber 110 may include a processing container having a cylindrical shape. The chamber 110 may include a chamber cover, a bottom plate and side walls. The bottom plate and the side walls may be integrally formed. Each of the chamber cover, the bottom plate and the side walls may include aluminum, stainless steel, etc. The exhaust portion 116 may include a vacuum pump, to control a pressure of the chamber 110 so that a processing space inside the chamber 110 may be depressurized to a desired/predetermined vacuum level. For example, process by-products and residual process gases may be discharged from the chamber 110 through an exhaust port 114.

The substrate stage 120 may be arranged within the chamber 110 to support the substrate. The substrate stage 120 may include a substrate heater 150 therein. The substrate heater 150 may include a heating element configured to heat the substrate to a desired/predetermined temperature. A power from a heater power supply 152 may be supplied to the substrate heater 150. For example, the substrate heater 150 may include a heating element, and the heating element may include a resistive coil. The substrate heater 150 may include an insulation material such as alumina, aluminum nitride, etc. The heating element may be heated to a temperature range of about 100° C. to about 700° C. The resistive coil may be arranged concentrically. For example, the resistive coil may include plural rings of resistive material. For example, the plural resistive rings may be electrically connected to each other. In certain embodiments, the resistive coil may have a spiral shape.

In certain embodiments, the substrate stage 120 may further include an electrostatic electrode (not illustrated) configured to hold the wafer W thereon using electrostatic force. The plasma generator may include a RF electrode (not illustrated) installed in the substrate heater 120, to which a radio frequency may be applied to induce plasma.

The gas distribution assembly may include a shower head 130 which supplies a deposition gas and/or a plasma gas into a processing region on the substrate stage 120. The shower head 130 may be provided in a chamber cover 112. A gas supply source 140 may be connected to the shower head 130 by a first gas supply line 142. The shower head 130 may supply a first process gas for a pre-treatment process. For example, the first process gas may include a hydrogen ($H_2$) gas. The shower head 130 may supply a second process gas for a deposition process. The second process gas may include a tungsten hexafluoride ($WF_6$) gas. In certain embodiments, the shower head 130 may supply an argon (Ar) gas, a helium (He) gas, etc.

In example embodiments, a backside gas channel 124 for supplying a backside gas may be formed in the substrate stage 120. The gas supply source 140 may be connected to the backside gas channel 124 by a second gas supply line 144. For example, the backside gas may include a hydrogen ($H_2$) gas, an argon (Ar) gas, etc. As will be described later, the backside gas may be supplied between an end portion of the wafer W and the edge ring 200 through the backside gas channel 124 to suppress/prevent a thin layer from being formed on a backside of the wafer W and a bevel portion of the wafer W. For example, the backside and the bevel portion of the wafer W may be excluded from forming a thin film in the corresponding process. For example, in some embodiments, a film layer is not formed on the bevel portion and a lower surface of the wafer W while a film layer is formed on an upper surface of the wafer. For example, the bevel portion may be a slanted edge or a chamfered edge of the wafer W. In certain embodiments, the bevel portion of the wafer W may be a rounded edge (e.g., a rounded bullet shape) of the wafer W.

In example embodiments, the substrate processing apparatus 100 may include a lift mechanism (e.g., a lift) configured to elevate the substrate stage 120. The lift mechanism may include a driving motor to elevate or lower a support shaft connected to the substrate stage 120. The driving motor may elevate or lower the support shaft through a gear drive.

The lift mechanism may include a bellows 126 attached between an end portion of the support shaft and a bottom of the chamber 110. The bellows 126 may allow a free vertical movement of the support shaft and may airtightly seal the chamber 110 from the outside.

In example embodiments, the edge ring 200 may be mounted around the wafer W on the substrate stage 120 to extend above an edge region of the wafer W. For example, the edge ring 200 may surround the wafer W when the wafer W is disposed on the substrate stage 120, and the edge ring 200 may vertically overlap the edge region of the wafer W along the circumference of the wafer W. For example, after the wafer W is seated on the substrate stage 120, the edge ring 200 may be mounted on the substrate stage 120 and then a deposition process may be performed on the wafer W. After completing the deposition process, the edge ring 200 may be separated from the substrate stage 120 and the wafer W may be unloaded from the substrate stage 120.

In a state where the substrate stage 120 is lowered in the chamber 110, the edge ring 200 may be supported on a ring support 118 provided on an inner wall of the chamber 110. For example, the ring support 118 may be disposed on a sidewall of the chamber 110. After the wafer W is seated on the substrate stage 120, the substrate stage 120 may be raised to lift the edge ring 200 from the ring support 118 so that the edge ring 200 may be mounted on the substrate stage 120 as illustrated in FIG. 3. In example embodiments, an alignment positioning groove or slot may be formed in the edge ring 200 for aligning the edge ring 200 with the substrate stage 120.

In certain embodiments, the substrate processing apparatus 100 may include a plate lift movable upwardly from and downwardly toward the substrate stage 120 to move the edge ring 200 onto the substrate stage 120, instead of the ring support 118. In this case, in a state where the plate lift having the edge ring 200 mounted thereon is raised, the wafer W may be seated on the substrate stage 120. Then, the plate lift may be lowered to mount the edge ring 200 on the substrate stage 120, e.g., before depositing a film layer on the wafer W.

Hereinafter, detailed features of the edge ring of FIG. 3 will be explained with reference to FIGS. 4 through 13.

Figure 4:
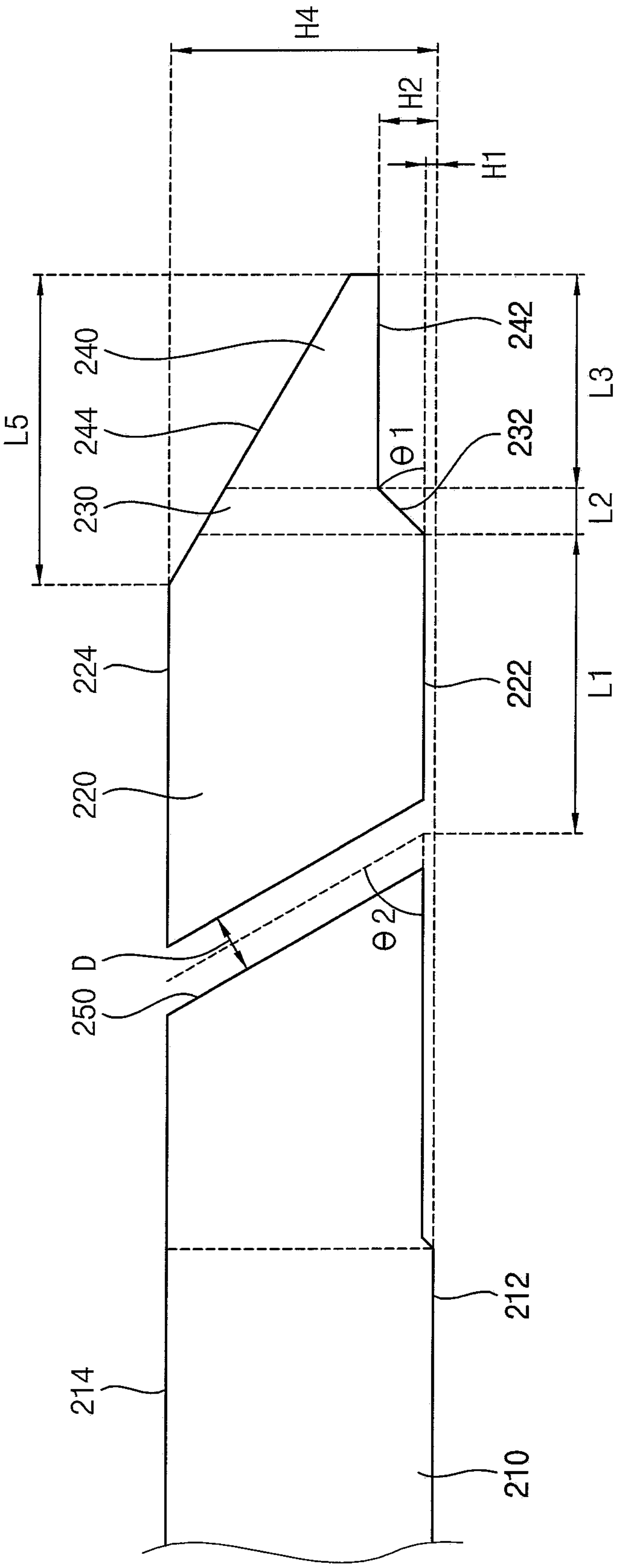
Figure 5:
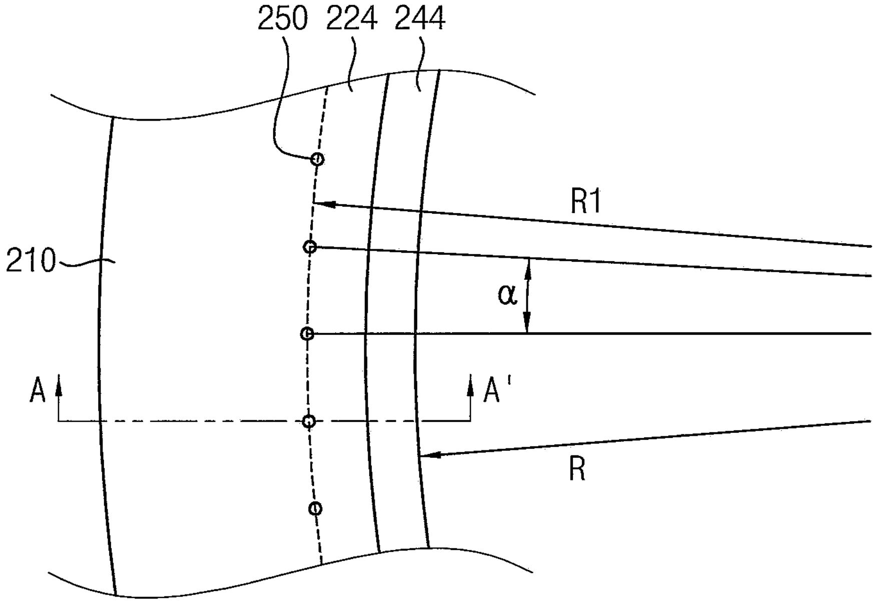
Figure 6:
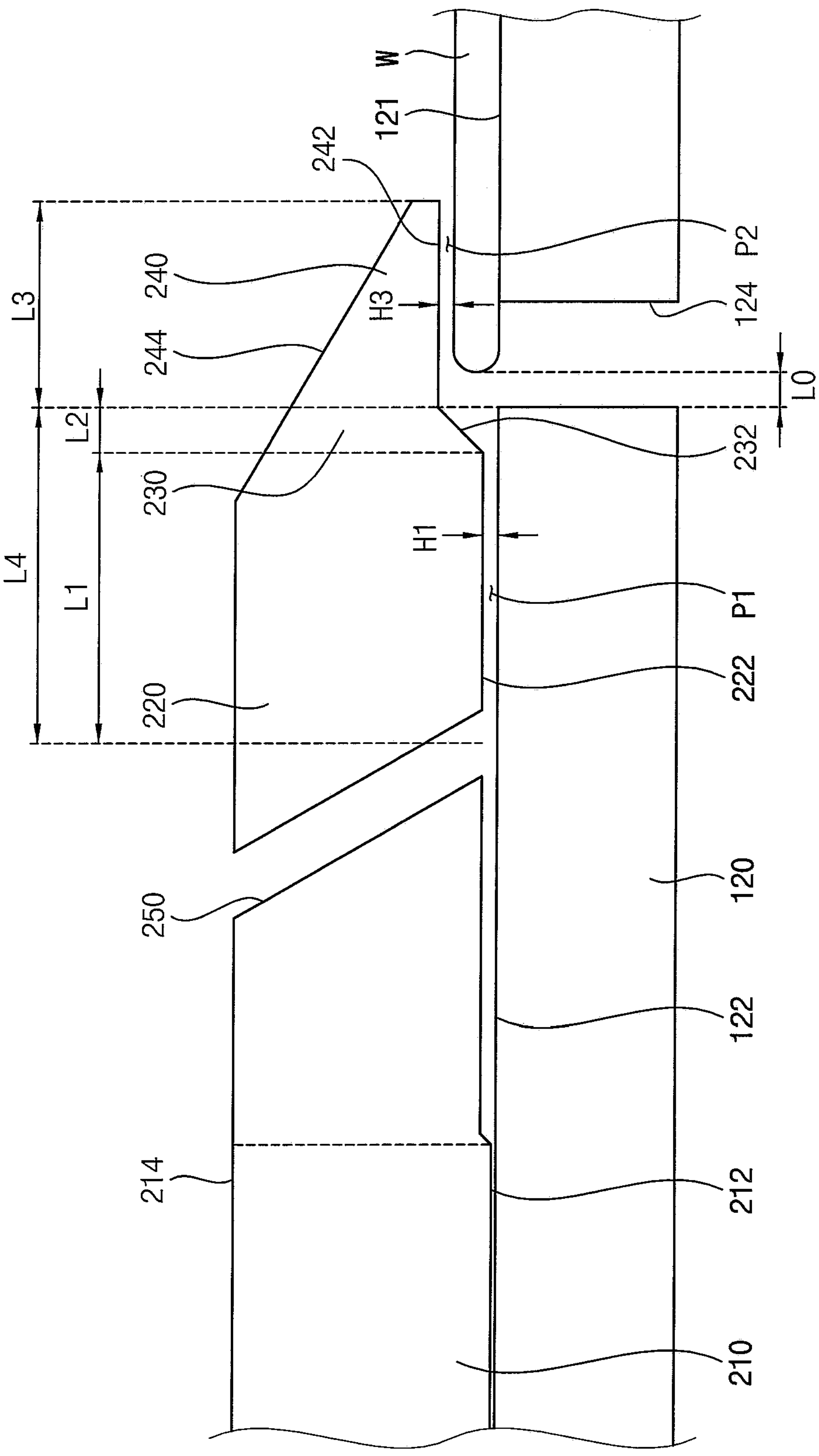
Figure 7:
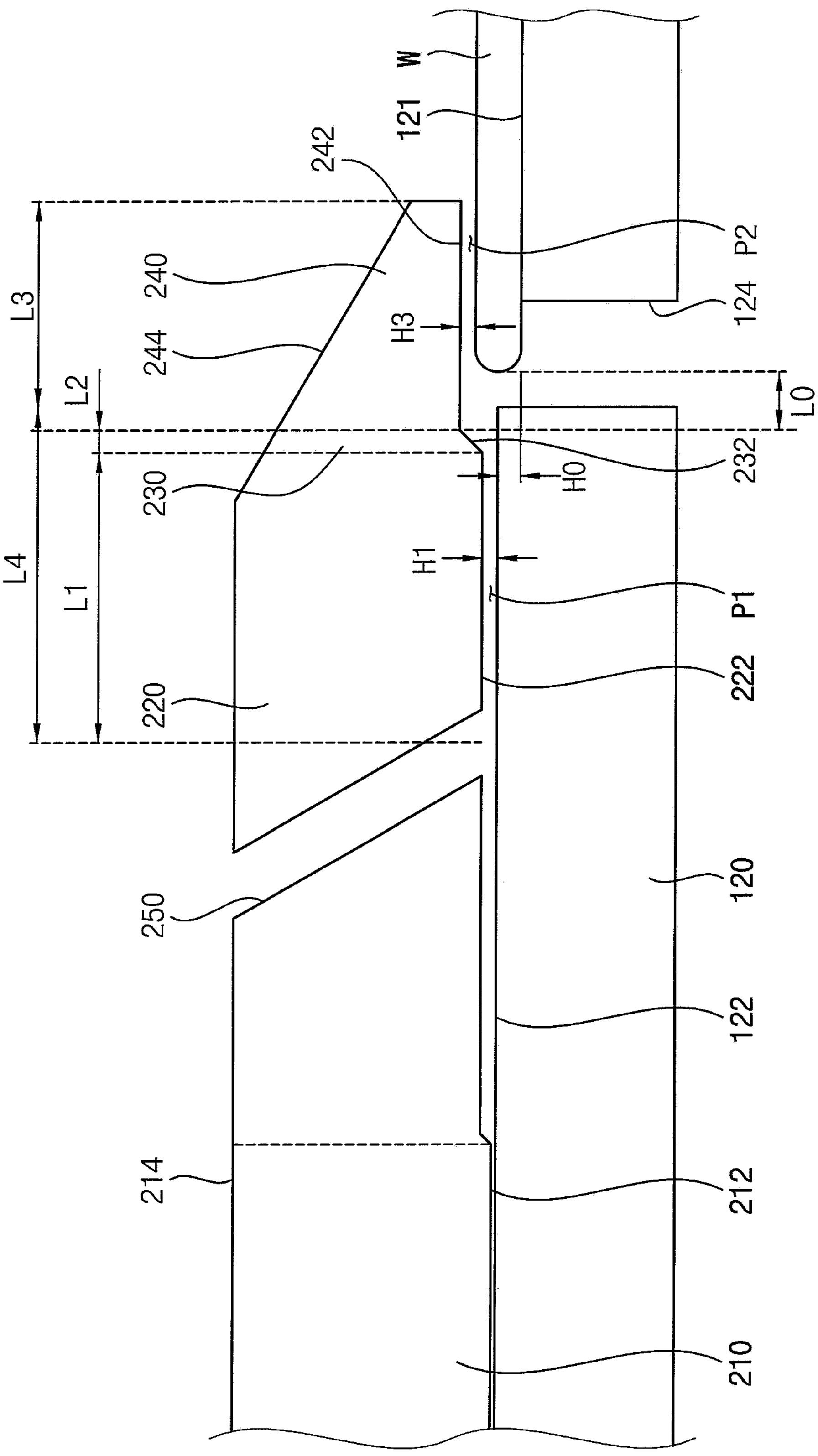

FIG. 4 is a cross-sectional view illustrating a portion of the edge ring in FIG. 3. FIG. 5 is a plan view illustrating a portion of the edge ring in FIG. 3. FIGS. 6 and 7 are cross-sectional views illustrating the edge ring mounted on the substrate stage. FIG. 4 is a cross-sectional view taken along the line A-A' in FIG. 5. FIG. 6 represents a case that a wafer seating surface 121 of the substrate stage is coplanar with an edge ring seating surface 122 of the substrate stage, and FIG. 7 represents a case that the wafer seating surface 121 of the substrate stage is lower than the edge ring seating surface 122 of the substrate stage.

Referring to FIGS. 4 to 7, the edge ring 200 may include an annular shaped body portion 210, and a first step portion 220, an inclined portion 230 and a second step portion 240 sequentially provided along an inner periphery of the body portion 210. In example embodiments, the edge ring 200 may include a plurality of passages. For example, the plurality of passages may be paths through which a backside gas may flow into the chamber 110 during a film deposition process. For example, each of the passages may be a trench, a through hole or a gap between two or more surfaces.

The body portion 210 may have an annular bottom surface 212 and an annular top surface 214. The body portion 210 may be supported by and disposed on the substrate stage 120 while the substrate processing apparatus 100 processes substrates. For example, the bottom surface 212 of the body portion 210 may face and contact an edge ring seating surface 122 of the substrate stage 120. The bottom surface 212 may be substantially even. For example, the body portion 210 may have a flat annular bottom surface 212, a flat annular top surface 214, and a homogeneous solid throughout and between the bottom surface 212 and the top surface 214. In case that a second ring such as a purge ring is mounted on the substrate stage 120, the bottom surface 212 of the body portion 210 may be supported by and disposed on the purge ring.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "parallel," "uniform," "planar," "coplanar," "cylindrical," "square," etc., as used herein when referring to orientation, layout, location, shapes, sizes, amounts, or other measures, encompass acceptable variations from exact identically, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

The first step portion 220 may have an annular shape extending along the inner periphery of the body portion 210. A first bottom surface 222 of the first step portion 220 may be an annular even/flat surface. The first bottom surface 222 may be positioned higher than the bottom surface 212 by a first height H1. A height described herein may be a vertical distance with respect to a horizontal plane, e.g., a plane in which the edge ring seating surface 122 is placed. A first top surface 224 of the first step portion 220 may be an annular even/flat surface. In certain embodiments, the first top surface 224 of the first step portion 210 may include a downwardly bent surface in an inner edge portion toward the center of the edge ring 200 as shown in FIG. 4. In certain embodiments, the first step portion 210 may be formed with a homogeneous solid throughout and between the first bottom surface 222 and the first top surface 224.

The inclined portion 230 may have an annular shape extending along an inner periphery of the first step portion 220. The inclined portion 230 may have an inclined bottom surface 232 extending at a first angle θ1 with respect to a plane extending parallel to the first bottom surface 222 toward the center of the body portion 210 as shown in FIG. 4. For example, the first angle θ1 may range from 30 degrees to 60 degrees with respect to the plane parallel to the first bottom surface 222. The inclined portion 230 may have a top surface inclined downwardly with respect to the top surface 214 of the body portion 210. The inclined bottom surface 232 of the inclined portion 230 may extend inwardly in a radial direction by a second radial distance L2.

The second step portion 240 may have an annular shape extending along an inner periphery of the inclined portion 230. A second bottom surface 242 of the second step portion 240 may be an annular even/flat surface. The second bottom surface 242 may be positioned higher than the bottom surface 212 of the body portion 210 by a second height H2 greater than the first height H1. The second step portion 240 may have a top surface 244 inclined downwardly with respect to the top surface 214 of the body portion 210. The second bottom surface 242 of the second step portion 240 may extend inwardly in a radial direction by a third radial distance L3. For example, the third radial distance L3 of the second bottom surface 242 may be the width of the second bottom surface 242 in the radial direction.

A plurality of the passages may be arranged in a circumferential direction of the edge ring 200 to be spaced apart from each other. The passage may be a through hole 250 extending outwardly at a second angle θ2 from the first bottom surface 222 of the first step portion 220. For example, the second angle θ2 may range from 0 degree to 90 degrees. For example, the through hole 250 may have a circular cross-section. A diameter D of the circular cross-section of the through hole 250 may range from 1 mm to 1.5 mm. A central angle α between adjacent through holes 250 may range from 1 degree to 5 degrees. For example, the central angle α may be between the closest two through holes 250 with respect to the center of the edge ring 200 in a plan view. The first bottom surface 222 of the first step portion 220 may extend inwardly in a radial direction by a first radial distance L1 from a center of the through hole 250 in a plane in which the first bottom surface 222 is disposed. For example, a portion of the first bottom surface 222 may also extend outwardly from the center of the through hole 250 toward the body portion 210 of the edge ring 200. In certain embodiments, a radial distance of the outwardly extending first bottom surface 222 may be substantially the same as the first radial distance L1.

As illustrated in FIGS. 6 and 7, the inclined bottom surface 232 of the inclined portion 230 of the edge ring 200 may be positioned adjacent toward the end portion of the wafer W. For example, the inclined bottom surface 232 of the inclined portion 230 may face the end portion (e.g., a beveled edge, a chamfered edge or a rounded edge) of the wafer W when the wafer W is mounted on the wafer seating surface 121 of the substrate stage 120. For example, the wafer W may be seated on the wafer seating surface 121 of the substrate stage 120 such that the end portion of the wafer W extends to the backside gas channel 124 (e.g., disposed on a top of the backside gas channel 124). A first exhaust passage P1 may be formed between the first bottom surface 222 of the first step portion 220 and the edge ring seating surface 122 of the substrate stage 120, and a second exhaust passage P2 may be formed between the second bottom surface 242 of the second step portion 240 and an upper surface of the wafer W. For example, the first and second exhaust passages P1 and P2 are paths through which the backside gas is exhausted from the backside gas channel 125 and supplied into the chamber 110.

A backside gas supplied between the end portion of the wafer W and the edge ring 200 through the backside gas channel 124 may proceed toward the inclined bottom surface 232 of the inclined portion 230, and then, a first portion of the backside gas may pass through the through hole 250 via the first exhaust passage P1 to be discharged into the chamber 110 and a remaining second portion of the backside gas may pass between the edge ring 200 and the end portion of the wafer W via the second exhaust passage P2 to be discharged into the chamber 110.

As will be described later, the edge ring 200 may adjust a concentration distribution of the first portion and the second portion of the backside gas to provide improved deposition characteristics at the bevel portion and the edge portion of the wafer W. For example, gas concentration may be a ratio of the backside gas to total gas (e.g., including processing gas). The edge ring 200 may be designed to control distribution profile of the backside gas concentration in the vicinity of the edge region of the wafer W. The range of the first angle θ1 of the inclined bottom surface 232 of the inclined portion 230 may be a control factor of gas flow characteristics at the bevel/end portion of the wafer W. For example, the edge ring 200 may be so configured that the gas flow rate between the first and second exhaust passages P1 and P2 may be mainly determined by the first angle θ1 of the inclined bottom surface 232 of the inclined portion 230 and the second angle θ2 of the through hole 250 may subsidiarily control the flow rate between the first and second exhaust passages P1 and P2.

In example embodiments, a fourth radial distance L4 from a position (e.g., a center) of the through hole 250 on a plane in which the first bottom surface 222 is placed to the inner periphery of the inclined portion 230 may be greater than the third radial distance L3 of the second bottom surface 242 of the second step portion 240 (L4>L3). Thus, a fluctuation of gas flow passing through a gap between the edge ring 200 and the end portion of the wafer W may be minimized.

The second step portion 240 may extend above the wafer W supported by and disposed on the substrate stage 120. The second bottom surface 242 of the second stepped portion 240 may be positioned above the upper surface of the wafer W by a third height H3. A ratio H1/H3 of the first height H1 to the third height H3 may be within a range of 1 to 3. At this time, a ratio (D/H1) of the diameter D of the through hole 250 to the first height H1 may be within a range of 5 to 10. Thus, flow rates per unit area of the first portion and the second portion of the backside gas may be adjusted.

A spacing distance L0 between the inner periphery of the inclined portion 230 and the wafer W in a radial direction, e.g., in a plan view, may be less than 1.2 mm, and a difference value (L3-L0) between the third radial distance L3 of the second bottom surface 242 of the second step portion 240 and the spacing distance L0 may be within a range of 1.0 mm to 2.5 mm. The difference value (L3-L0) may be determined so as to maintain a constant flow rate of gas passing through the gap between the edge ring 200 and the end portion of the wafer W.

Figure 8:
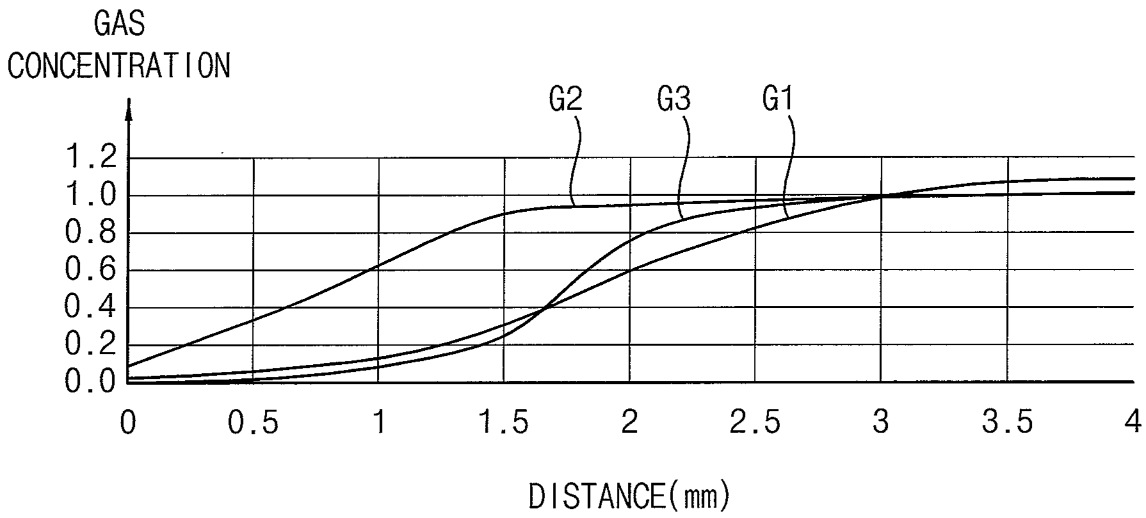

FIG. 8 is a graph showing gas concentrations at an end portion of a wafer according to an edge ring in accordance with first and second comparative examples and an example embodiment. For example, FIG. 8 shows profiles of processing gas concentrations which result from provision of backside gas. The distances of the graphs of FIG. 8 are distances from an edge of a wafer W toward a center of the wafer W. The processing gas may be a tungsten based gas, and the backside gas may be an argon based gas.

Referring to FIG. 8, a graph G1 shows a gas concentration at an end/edge portion of a wafer W in case of using an edge ring according to a first comparative example (there is no through hole, Classic Ring), a graph G2 shows a gas concentration at the end portion of the wafer W in case of using an edge ring according to a second comparative example (there is a through hole, MOER (Minimum Overlapped Exclusion Ring), and a graph G3 shows a gas concentration at the end portion of the wafer W in case of using an edge ring according to an example embodiment (MPR, Multi-Purpose Ring).

As can be seen from the graph G1, in the case of the edge ring according to the first comparative example, deposition on the bevel portion (within about 1.0 mm from the end) of the wafer W may be prevented, but an edge distribution may be deteriorated. As can be seen from the graph G2, in the case of the edge ring according to the second comparative example, an edge distribution of processing/backside gas may be controlled, but a film layer may be deposited on the bevel portion of the wafer W. However, in the case of the edge ring according to an example embodiment, it may be seen that deposition at the bevel portion (within about 1.0 mm from the end) of the wafer W may be prevented and excellent edge distribution may be obtained.

As mentioned above, the edge ring 200 may include the first step portion 220, the inclined portion 230 and the second step portion 240 sequentially provided around the inner periphery of the body portion 210. For example, the body portion 210, the first step portion 220, the inclined portion 230 and the second step portion 240 may be integrally formed to constitute the edge ring 200 as a whole. The inclined bottom surface 232 of the inclined portion 230 may be arranged between the first bottom surface 222 of the first step portion 220 and the second bottom surface 242 of the second step portion 240. For example, the inclined bottom surface 232 may connect the first bottom surface 222 and the second bottom surface 242. For example, the first bottom surface 222, the inclined bottom surface 232 and the second bottom surface 242 may be sequentially and continuously formed toward the center of the edge ring 200.

The backside gas supplied between the end portion of the wafer W and the edge ring 200 through the backside gas channel 124 may proceed toward the inclined bottom surface 232 of the inclined portion 230, and then, the first portion of the backside gas may pass through the through hole 250 via the first exhaust passage P1 to be discharged into the chamber 110 and the remaining second portion of the backside gas may pass through a gap between the edge ring and the edge portion of the wafer W via the second exhaust passage P2 to be discharged into the chamber 110.

Accordingly, the concentration distribution of the first portion and the second portion of the backside gas may be adjusted to provide improved deposition characteristics at the bevel portion and the edge portion of the wafer W. For example, the bevel portion of the wafer W may be a side surface of the wafer W, and the edge portion of the wafer may be an edge portion of the top surface of the wafer W.

Figure 9:
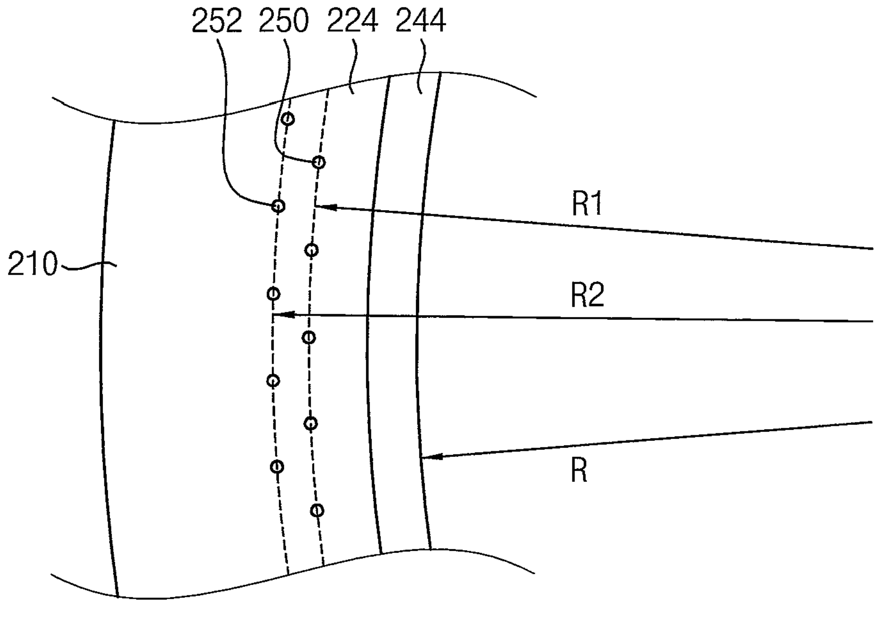

FIG. 9 is a plan view illustrating a portion of an edge ring in accordance with example embodiments. The edge ring may be substantially the same as or similar to the edge ring described with reference to FIGS. 4 to 7 except for arrangements of through holes. Thus, same reference numerals will be used to refer to the same or like elements and any further repetitive explanation regarding above described elements will be omitted.

Referring to FIG. 9, an edge ring 200 may include a plurality of passages. A plurality of the passages may be formed in a first step portion of the edge ring 200. The passages may include first through holes 250 arranged to be spaced apart from each other along a first circumferential direction at a first distance from the center of a body portion 210 and second through holes 252 arranged to be spaced apart from each other along a second circumferential direction at a second distance from the center of the body portion 210.

The first through holes 250 may be spaced apart from the center of the body portion 210 by a first radius R1, and the second through holes 252 may be spaced apart from the center of the body portion 210 by a second radius R2 greater than the first radius R1. The first and second through holes 250 and 252 may be arranged alternately to each other along an extending direction of the first step portion 220.

Figure 10:
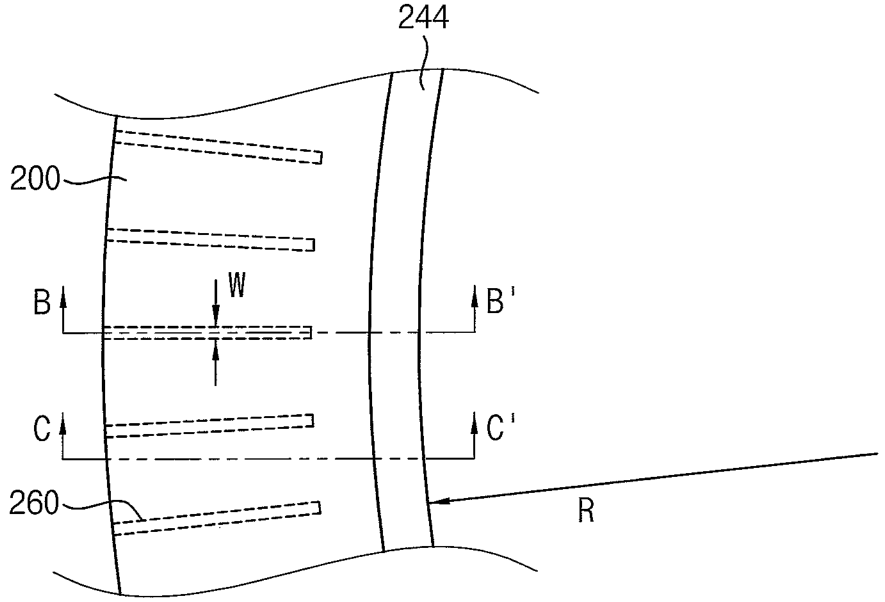
Figure 11:
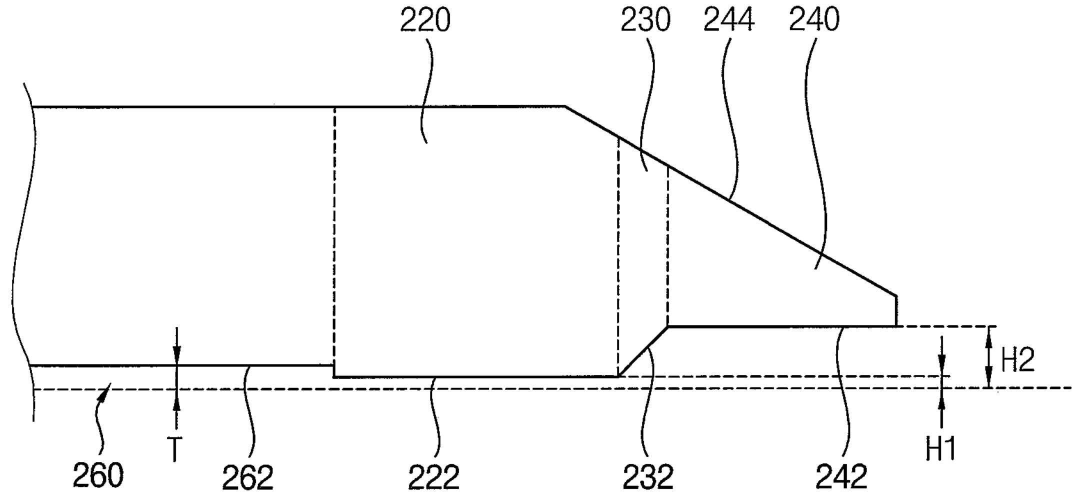
Figure 12:
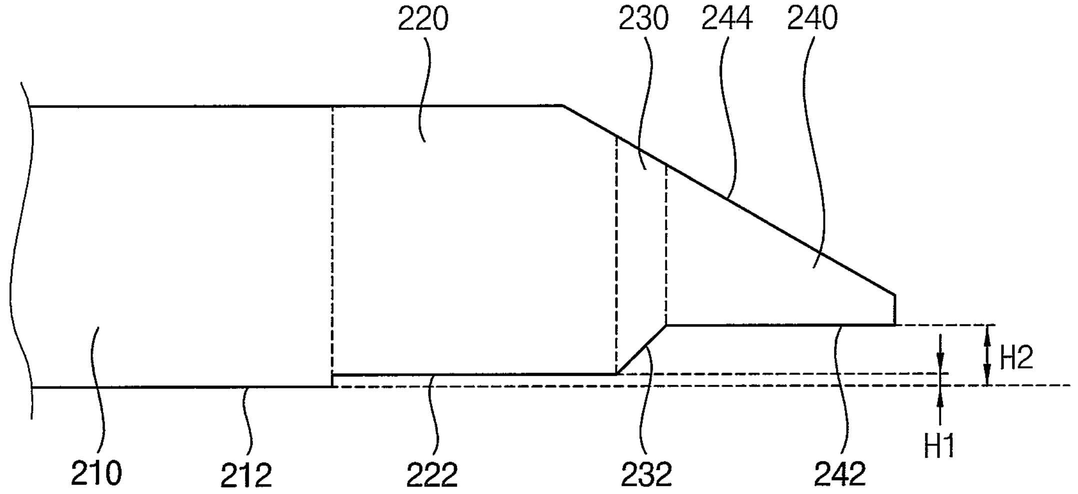
Figure 13:
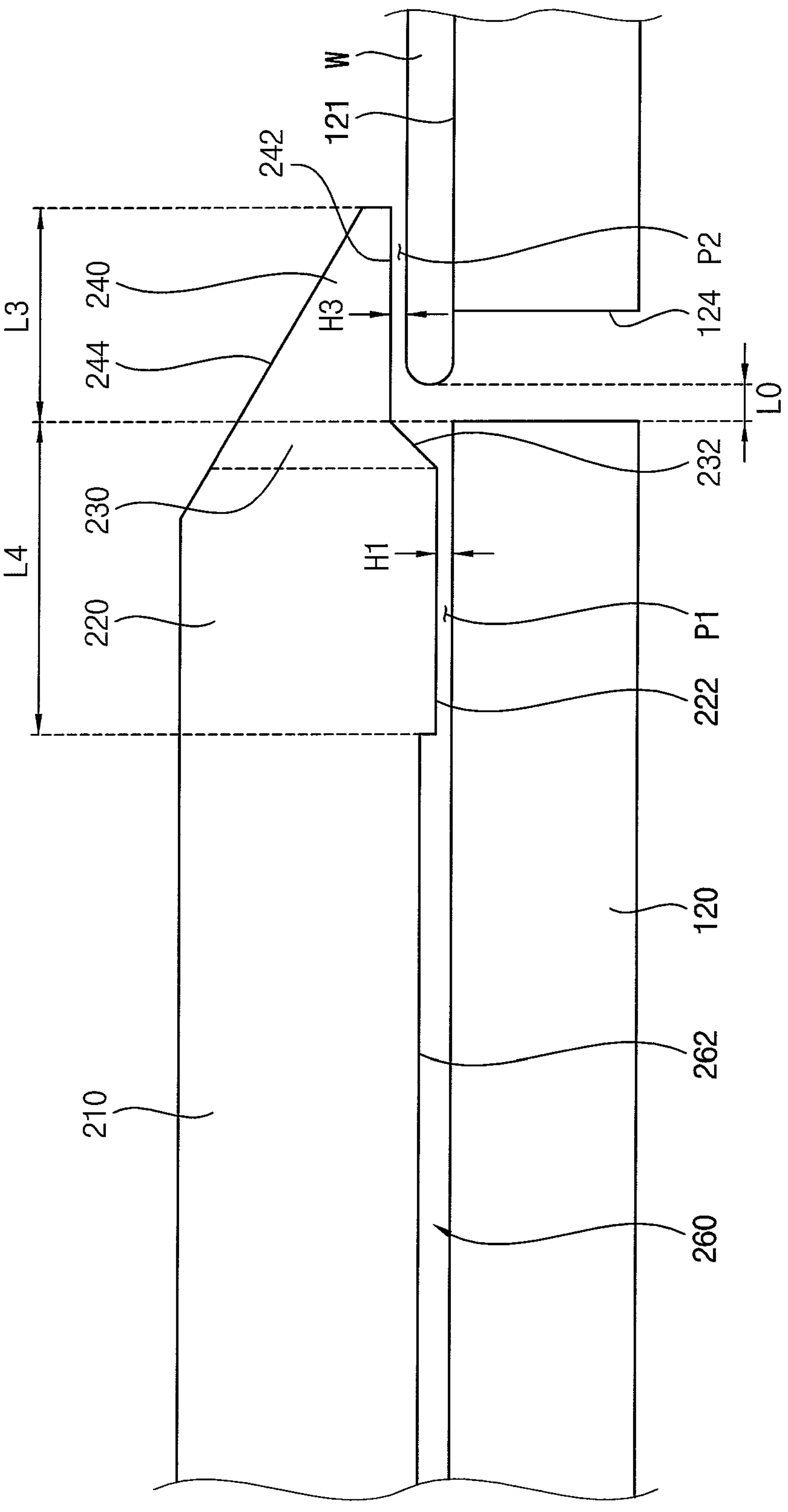

FIG. 10 is a plan view illustrating a portion of an edge ring in accordance with example embodiments. FIG. 11 is a cross-sectional view taken along the line B-B' in FIG. 10. FIG. 12 is a cross-sectional view taken along the line C-C' in FIG. 10. FIG. 13 is a cross-sectional view illustrating the edge ring of FIG. 10 mounted on a substrate stage. The edge ring may be substantially the same as or similar to the edge ring described with reference to FIGS. 4 to 7 except for configurations of passages. Thus, same reference numerals will be used to refer to the same or like elements and any further repetitive explanation regarding elements described above will be omitted.

Referring to FIGS. 10 to 13, an edge ring 200 may include a plurality of passages. Each of the passages may be a trench 260 which extends along a radial direction on a bottom surface 212 of a body portion 210 from a first bottom surface 222 of a first step portion 220. The trench 260 may have a width W and a depth T.

The trench 260 may be connected to a first exhaust passage P1 between the first bottom surface 222 of the first step portion 220 and an edge ring seating surface 122 of a substrate stage 120. Accordingly, a first portion of a backside gas may pass through the trench 260 via the first exhaust passage P1 to be discharged into a chamber 110.

A ratio (T/H1) of the depth T of the trench 260 to the first height H1 of the first bottom surface 222 may be at least 1 ($1 \leq (T/H1)$). A ratio (W/T) of the width (W) to the depth T of the trench 260 may be 10 or less ($W/T \leq 10$). Thus, a flow rate per unit area of the first portion of the backside gas may be properly adjusted.

The above substrate processing apparatus may be used to manufacture semiconductor devices including logic devices and memory devices. For example, a method of manufacturing a semiconductor device may comprise placing a wafer on the substrate stage of the substrate processing apparatus, placing the edge ring on the substrate stage to vertically overlap an edge of the wafer, depositing a film layer on the wafer, and patterning the film layer. For example, the patterning may include a photolithography process, and the film layer may be a conductive film layer like tungsten or copper. For example, the semiconductor device may be applied to various systems such as a computing system. The semiconductor device may include finFET, DRAM, VNAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing system, comprising:

a substrate stage having a wafer seating surface and a backside gas channel;

a wafer seated on the wafer seating surface; and an edge ring supported by the substrate stage, the edge ring comprising:

an annular shaped body portion mounted on the substrate stage and having an annular bottom surface contacting the substrate stage and an annular top surface;

a first step portion extending along an inner periphery of the annular shaped body portion and having a first annular bottom surface positioned higher than the annular bottom surface of the annular shaped body portion by a first height;

an inclined portion extending along an inner periphery of the first step portion and having an inclined bottom surface extending at a first angle with respect to a first plane in which the first annular bottom surface is placed;

a second step portion extending along an inner periphery of the inclined portion and extending to an innermost extent of a second annular bottom surface defined by the second step portion, the second step portion vertically overlapping the wafer seated on the wafer seating surface, the second annular bottom surface positioned higher than the annular bottom surface of the annular shaped body portion by a second height greater than the first height, the second annular bottom surface positioned over the backside gas channel of the substrate stage; and a plurality of passages extending outwardly at a second angle from the first annular bottom surface of the first step portion, wherein a vertical distance between the second annular bottom surface and a top surface of the wafer is a third height, wherein a relationship between the first height and the third height is configured to control a proportion of a backside gas that flows through the plurality of passages, the inclined bottom surface of the inclined portion is positioned to face an end portion of the wafer seated on the wafer seating surface, and a portion of the first annular bottom surface is located between the plurality of passages and the backside gas channel.

2. The substrate processing system of claim 1, wherein the first angle is within a range of 30 degrees to 60 degrees, and the second angle is within a range of 0 degrees to 90 degrees.

3. The substrate processing system of claim 1, wherein a first radial distance from a center of each passage of the plurality of passages at the first plane to the inner periphery of the inclined portion is greater than a radial distance of the second annular bottom surface.

4. The substrate processing system of claim 3, wherein the first radial distance is a sum of a radial distance from the center of each passage of the plurality of passages at the first plane to an innermost end of the first annular bottom surface and a radial distance of the inclined portion.

5. The substrate processing system of claim 1, wherein a ratio of the first height to the third height is within a range of 1 to 3.

6. The substrate processing system of claim 5, wherein each passage of the plurality of passages includes a through hole having a circular cross-section, and a ratio of a diameter of the circular cross-section of the through hole to the first height is within a range of 5 to 10.

7. The substrate processing system of claim 5, wherein a spacing distance between the inner periphery of the inclined portion and the wafer in a plan view is less than 1.2 mm, and a difference between a radial distance of the second annular bottom surface and the spacing distance is within a range of 1.0 mm to 2.5 mm.

8. The substrate processing system of claim 7, wherein the distance between the wafer seating surface and the second annular bottom surface is greater than the second height.

9. The substrate processing system of claim 7, wherein an opening of each of the plurality of passages is positioned lower than a top surface of the wafer.

10. The substrate processing system of claim 1, wherein each passage of the plurality of passages includes a trench, a ratio of a depth of the trench to the first height of the first annular bottom surface is at least 1, and a ratio of a width of the trench to the depth of the trench is 10 or less.

11. The substrate processing system of claim 1, wherein each passage of the plurality of passages is arranged to be spaced apart from each other along a circumferential direction.

12. The substrate processing system of claim 1, further comprising:

a gas supply configured to supply a gas on the substrate stage and a backside gas through the backside gas channel.

13. The substrate processing system of claim 1, wherein the annular bottom surface and the wafer seating surface are coplanar.

* * * * *